US011307110B2

(12) United States Patent
Lux et al.

(10) Patent No.: US 11,307,110 B2
(45) Date of Patent: Apr. 19, 2022

(54) PRESSURE-SENSOR ASSEMBLY HAVING A CARRIER SUBSTRATE

(71) Applicant: Robert Bosch GmbH, Stuttgart (DE)

(72) Inventors: Alexander Lux, Tambach-Dietharz (DE); Christian Hauer, Remshalden (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/717,282

(22) Filed: Dec. 17, 2019

(65) Prior Publication Data

US 2020/0200633 A1    Jun. 25, 2020

(30) Foreign Application Priority Data

Dec. 21, 2018   (DE) .......................... 102018222781.0

(51) Int. Cl.
| | |
|---|---|
| *G01L 19/06* | (2006.01) |
| *H01L 23/13* | (2006.01) |
| *H01L 23/498* | (2006.01) |
| *H01L 23/00* | (2006.01) |
| *H01L 23/24* | (2006.01) |
| *H01L 23/14* | (2006.01) |

(Continued)

(52) U.S. Cl.
CPC ........ *G01L 19/0627* (2013.01); *G01L 9/0042* (2013.01); *G01L 19/0069* (2013.01); *H01L 23/13* (2013.01); *H01L 23/145* (2013.01); *H01L 23/24* (2013.01); *H01L 23/49838* (2013.01); *H01L 24/32* (2013.01); *H01L 24/48* (2013.01); *H01L 24/73* (2013.01); *H01L 2224/32225* (2013.01); *H01L 2224/48091* (2013.01); *H01L 2224/48106* (2013.01); *H01L 2224/48227* (2013.01); *H01L 2224/73265* (2013.01)

(58) Field of Classification Search
CPC ........... G01L 9/0058; G01L 2009/0063; G01L 19/0046; G01L 19/0645; G01L 19/0627
See application file for complete search history.

(56) References Cited

U.S. PATENT DOCUMENTS 5,357,673 A * 10/1994 Polak ...................... H01L 21/56
                                                                 174/521
5,780,928 A *  7/1998 Rostoker ............... H01L 23/427
                                                                 257/713

(Continued)

FOREIGN PATENT DOCUMENTS

EP              0927337 A1     7/1999

*Primary Examiner* — Tran M. Tran
(74) *Attorney, Agent, or Firm* — Norton Rose Fulbright US LLP; Gerard Messina

(57) ABSTRACT

For a pressure-sensor assembly, including a carrier substrate having conductor tracks disposed on a first side of the carrier substrate, a pressure-sensor element that is mounted on the first side of the carrier substrate and is electrically contacted via a bonding-wire connection to a conductor track located on the first side of the carrier substrate, as well as a frame part having a full-perimeter frame wall, the frame part being positioned on the first side of the carrier substrate around the pressure-sensor element, and the frame part being filled with a gel covering the pressure-sensor element, it is provided that in addition to the full-perimeter frame wall, the frame part has a base which is positioned on at least one conductor track disposed on the first side of the carrier substrate.

9 Claims, 1 Drawing Sheet

(51) Int. Cl.
*G01L 9/00* (2006.01)
*G01L 19/00* (2006.01)

(56) References Cited

U.S. PATENT DOCUMENTS

| | | | | |
|---|---|---|---|---|
| 6,260,417 B1* | 7/2001 | Watanabe | G01L | 19/147 |
| | | | | 73/754 |
| 6,512,255 B2* | 1/2003 | Aoki | G01L | 19/141 |
| | | | | 257/254 |
| 6,518,659 B1* | 2/2003 | Glenn | H01L | 23/043 |
| | | | | 257/686 |
| 6,732,590 B1* | 5/2004 | Gottlieb | B60C | 23/0408 |
| | | | | 73/754 |
| 6,925,885 B2* | 8/2005 | Ishio | G01L | 19/143 |
| | | | | 73/715 |
| 7,036,380 B2* | 5/2006 | Fessele | G01L | 19/0645 |
| | | | | 73/706 |
| 7,216,545 B2* | 5/2007 | Uchida | G01L | 19/0627 |
| | | | | 73/705 |
| 7,216,546 B2* | 5/2007 | Hayashi | G01L | 23/24 |
| | | | | 73/708 |
| 7,553,688 B2* | 6/2009 | Bolken | H01L | 23/293 |
| | | | | 438/64 |
| 7,749,797 B2* | 7/2010 | Bauer | H01L | 24/83 |
| | | | | 438/64 |
| 8,196,474 B2* | 6/2012 | Reinmuth | G01L | 19/0061 |
| | | | | 73/706 |
| 8,215,176 B2* | 7/2012 | Ding | G01L | 19/0069 |
| | | | | 361/283.4 |
| 8,272,272 B2* | 9/2012 | Gebauer | G01L | 19/0084 |
| | | | | 361/283.4 |
| 8,299,549 B2* | 10/2012 | Reinmuth | H01L | 23/53252 |
| | | | | 257/415 |
| 8,501,517 B1* | 8/2013 | Yow | G01L | 19/147 |
| | | | | 257/E21.504 |
| 8,643,169 B2* | 2/2014 | Yow | G01L | 19/0654 |
| | | | | 257/704 |
| 8,716,846 B2* | 5/2014 | Yao | G01L | 19/0069 |
| | | | | 257/666 |
| 8,802,474 B1* | 8/2014 | Yao | G01L | 19/0069 |
| | | | | 257/415 |
| 9,379,033 B2* | 6/2016 | Wombacher | B81B | 7/0025 |
| 9,606,010 B2* | 3/2017 | Kaiser | G01L | 19/0627 |
| 9,945,747 B1* | 4/2018 | Kusanale | G01L | 19/0645 |
| 10,006,822 B2* | 6/2018 | Chen | G01L | 9/0055 |
| 10,247,629 B2* | 4/2019 | Chiou | B81B | 3/0021 |
| 10,330,552 B2* | 6/2019 | Uematsu | G01L | 19/0084 |
| 10,481,024 B2* | 11/2019 | Wade | A61M | 5/1452 |
| 10,514,314 B2* | 12/2019 | Takimoto | G01L | 19/069 |
| 10,549,982 B2* | 2/2020 | Duqi | B81B | 7/0041 |
| 10,677,675 B2* | 6/2020 | Vaupel | G01L | 19/14 |
| 10,717,645 B2* | 7/2020 | Feyh | H01L | 23/28 |
| 10,720,534 B2* | 7/2020 | Tomita | G01L | 19/0069 |
| 10,947,109 B2* | 3/2021 | Vaupel | H01L | 23/16 |
| 11,009,412 B2* | 5/2021 | Abbasi Gavarti | G01L | 9/06 |
| 11,041,774 B2* | 6/2021 | Tu | G01L | 19/143 |
| 2004/0093954 A1* | 5/2004 | Gottlieb | B60C | 23/0408 |
| | | | | 73/754 |
| 2017/0233245 A1* | 8/2017 | Duqi | G01L | 9/0054 |
| | | | | 257/419 |
| 2017/0345949 A1* | 11/2017 | Tomita | H01L | 29/84 |
| 2019/0106321 A1* | 4/2019 | Vaupel | H01L | 23/49541 |
| 2020/0256752 A1* | 8/2020 | Okawa | G01L | 19/143 |

\* cited by examiner

PRESSURE-SENSOR ASSEMBLY HAVING A CARRIER SUBSTRATE

CROSS REFERENCE

The present application claims the benefit under 35 U.S.C. § 119 of German Patent Application No. DE 102018222781.0 filed on Dec. 21, 2018, which is expressly incorporated herein in its entirety.

BACKGROUND INFORMATION

In the automotive industry, pressure-sensor assemblies having a pressure-sensor element are often used, which require that the pressure-sensor element be protected from aggressive media. For example, pressure-sensor assemblies of this kind are also employed to detect a suction pressure in the intake manifold of an internal combustion engine. Thus, for instance, European Patent No. EP 0 927 337 B1 describes a pressure-sensor assembly which has a carrier substrate. The carrier substrate is provided on one side with a silicon chip as pressure-sensor element, that is electrically contacted via bonding-wire connections to a conductor track of the carrier substrate. The silicon chip has a membrane and pressure-sensitive electronic components. The electronic components form an electronic bridge circuit, for example. When pressure is applied to the membrane, the membrane is deflected, so that the bridge circuit generates a measuring signal representing the applied pressure, the measuring signal being transmitted via the bonding-wire connections to the carrier substrate on which, for instance, an evaluation circuit may additionally be located.

Moreover, the pressure-sensor device has a frame part that surrounds the pressure-sensor element and is filled with a gel covering the pressure-sensor element. The carrier substrate provided with the pressure-sensor element is inserted into a pressure-sensor housing. The housing is multipart and has at least one pressure connection for delivery of the pressure. Absolute pressure sensors are familiar, in which pressure is applied to the pressure-sensor element on one side, as well as differential pressure sensors, in which pressure is applied to the pressure-sensor element on two sides. The pressure applied at a pressure connection may be transferred via the gel to one side of the pressure-sensor element, that is, to the membrane of the pressure-sensor element. If desired, a second pressure may be applied to the opposite side of the membrane. In this case, the housing of the pressure sensor has a second pressure connection which directs the second pressure to the back side of the membrane.

SUMMARY

The present invention relates to a pressure-sensor assembly that has a carrier substrate having conductor tracks disposed on a first side of the carrier substrate, a pressure-sensor element that is mounted on the first side of the carrier substrate and is electrically contacted via a bonding-wire connection to a conductor track located on the first side of the carrier substrate, as well as a frame part having a full-perimeter frame wall, the frame part being positioned on the first side of the carrier substrate around the pressure-sensor element, and the frame part being filled with a gel covering the pressure-sensor element. According to the present invention, in addition to the full-perimeter frame wall, the frame part has a base which is positioned on at least one conductor track disposed on the first side of the carrier substrate.

In the case of the conventional pressure-sensor assemblies, generally, the pressure-sensor element is adhered onto the carrier substrate. In this context, the problem exists that for manufacturing reasons, the frame part, usually made of plastic, is often provided with burrs which make level seating on the carrier substrate difficult. In addition, the frame part rests only with the relatively narrow bottom side of the frame wall on the carrier substrate. Aggressive media are able to penetrate between the frame part and the carrier substrate along conductor tracks and gaps in the direction of the pressure-sensor element. In order to prevent aggressive media and air pockets from outgassing on the first side of the carrier substrate facing the pressure-sensor element and diffusing into the gel, where in response to pressure fluctuations, even small air bubbles tend to sudden expansion which may damage the bonding-wire connections, a passivation layer may be deposited onto the first side of the carrier substrate. But this passivation layer must be deposited over a relatively large area on the first side of the carrier substrate within the frame part in order to reliably prevent air pockets within the frame part on the first side of the carrier substrate from being able to penetrate up to the gel. However, depositing a passivation layer over a large area, or surface-finishing the first side of the carrier substrate over a large area within the frame part is relatively costly.

The pressure-sensor assembly according to the present invention utilizes a modified frame part which, in addition to the full-perimeter frame wall, has a base that is positioned on at least one conductor track disposed on the first side of the carrier substrate. The base is able to cover conductor tracks on the first side of the carrier substrate. With the aid of the frame part, air pockets are able to be avoided in the gel. Possible burr formation on the frame part and unevenness or microstructures on the first side of the carrier substrate are advantageously mostly covered by the frame part, so that the gel within the frame part is protected reliably against outgassing from the first side of the carrier substrate, since air pockets or aggressive substances are unable to diffuse here into the gel.

Advantageous refinements and further developments of the present invention are described herein.

In accordance with the present invention, the pressure-sensor element disposed within the frame part may be mounted, especially adhered, advantageously onto an inner side of the base pointing away from the carrier substrate. In this manner, cavities and air pockets in the area of the adhesive bonding of the pressure-sensor element may advantageously be avoided, since the pressure-sensor element is able to be adhered onto a smooth surface. The application of adhesive on the base of the frame part may be adjusted expediently with a defined meniscus. Mounting of the pressure-sensor element on an area of the carrier substrate provided with microscopically small gaps, at which outgassing into the gel may occur, is thus prevented. Advantageously, a large surface area of the carrier substrate in contact with the gel may thereby be avoided.

A bottom side of the base pointing toward the carrier substrate may be adhered beneficially onto the at least one conductor track with the aid of an adhesive layer. For the most part, the base of the frame part covers microstructures of the carrier substrate and of the conductor tracks of the carrier substrate such as cracks and pores, so that the adhesive bonding between the base and the carrier substrate is not critical.

It is particularly expedient if the base has at least one contacting opening, and at least one section of a conductor track within the contacting opening is not covered by the base. In this case, the bonding-wire connection is electrically contacted through the contacting opening to the section of the conductor track not covered in the contacting opening, the at least one bonding-wire connection being bonded or welded at one end to the pressure-sensor element, and with its other end onto the section within the contacting opening.

The section of the conductor track within the contacting opening not covered by the base may be covered in an easy manner with a passivation layer surrounding the other end of the at least one bonding-wire connection. Since the area within the frame wall of the frame part is mostly covered by the base in relation to the carrier substrate, only the deposition of a passivation layer with a relatively small superficial extent within the contacting opening is necessary for this purpose.

The gel may be applied within the frame part directly over the passivation layer. The gel therefore covers the base of the frame part, the pressure-sensor element, the passivation layer and the bonding-wire connection and protects them from aggressive substances.

Because of the encapsulation of the gel compartment of the frame part in relation to the carrier substrate, a relatively inexpensive, simple substrate, e.g., a printed circuit board made of glass-fiber-reinforced epoxy resin, may be used as carrier substrate.

In particular, the frame part, including the frame wall and the base, may be formed in one piece from plastic or metal.

DETAILED DESCRIPTION OF EXAMPLE EMBODIMENTS

Figure 1:
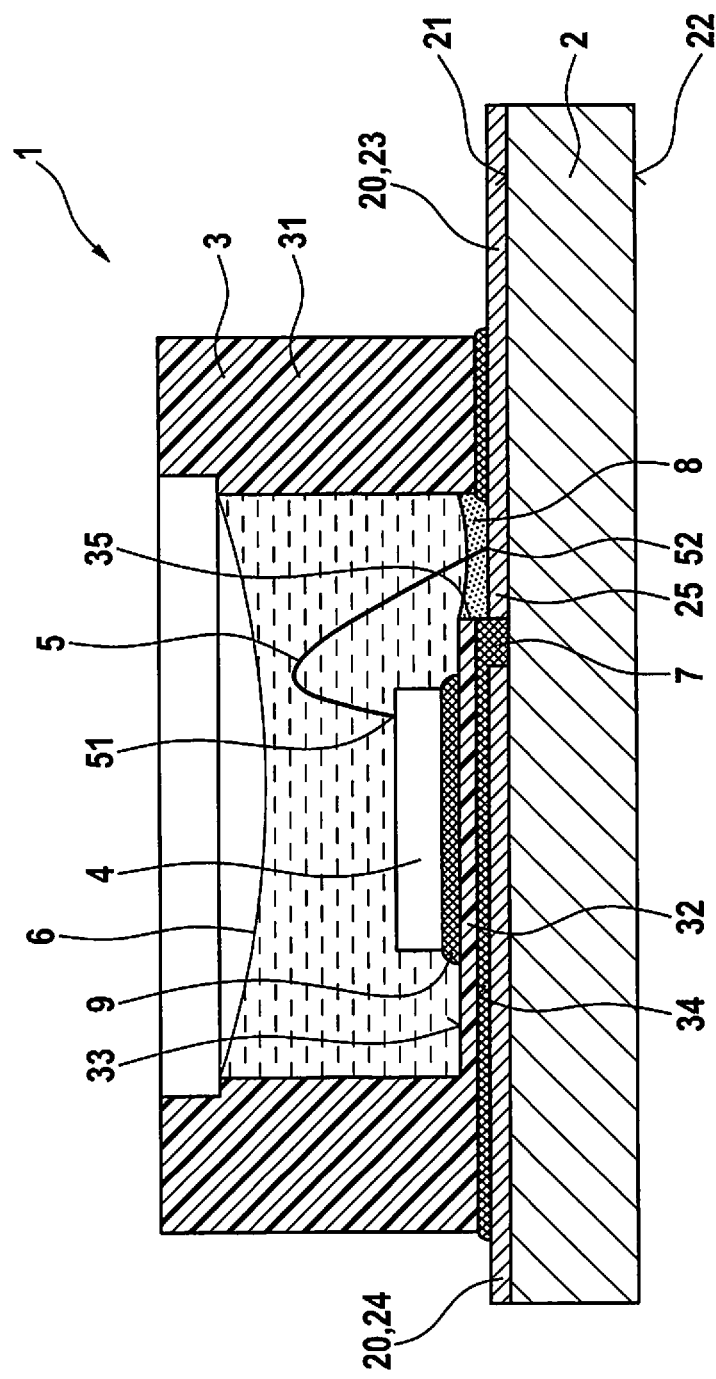
FIG. 1 shows a schematic cross-section through a pressure-sensor assembly according to the present invention.

FIG. 1 shows a schematic cross-section through a pressure-sensor assembly, which may be installed in a pressure-sensor housing. Further particulars concerning the mounting of such a pressure-sensor assembly in a pressure-sensor housing are omitted here. For instance, the installation may be carried out similarly to the integration into a pressure-sensor housing described in European Patent No. EP 0 927 337 B1.

Pressure-sensor assembly 1 has a carrier substrate 2 which may be a ceramic substrate or a printed circuit board, for example. Carrier substrate 2 may be board-like, with a first side 21 and a second side 22 facing away from it. Conductor tracks 20 are disposed at least on first side 21 of the carrier substrate. Conductor tracks 20 may be connected electrically, in a manner not shown, to inner conductor tracks via plated-through holes or vias (electrical interconnections). Of conductor tracks 20 on first side 21 of the carrier substrate, two conductor tracks 23 and 24 are illustrated.

A frame part 3 has a full-perimeter frame wall 31 and a base 32. Frame part 3 may be made in one piece out of plastic. Frame part 3 is adhered onto first side 21 of carrier substrate 2, preferably with the aid of an adhesive layer 7. In so doing, frame part 3 is positioned with base 32 over at least one conductor track 24 located on first side 21 of carrier substrate 2. In FIG. 1, it can be seen that adhesive layer 7 is applied between the side of frame wall 31 facing carrier substrate 2 and base 32, and the first side of carrier substrate 2 having conductor track 24.

Base 32 of frame part 3 has at least one contacting opening 35. Contacting opening 35 forms a through-opening in base 32. At least one section 25 of a conductor track 23 within contacting opening 35 is not covered by base 32.

A pressure-sensor element 4, which may be a silicon chip, for instance, is mounted on an inner side 33 of base 32. In particular, this may be accomplished with the aid of a further adhesive application 9 on inner side 33. Pressure-sensor element 4 may have a sensor membrane, not shown, and pressure-sensitive electronic components which generate a pressure signal in response to deformation of the membrane. Pressure may be applied to the pressure-sensor element on one side or both sides. If pressure is applied on both sides, in addition, a pressure channel is provided in carrier substrate 2 below the pressure-sensor element, which is not shown in FIG. 1.

Pressure-sensor element 4 may be connected to conductor tracks 20 via bonding-wire connections 5. FIG. 1 shows one bonding-wire connection 5 which is electrically contacted through contacting opening 35 to a section 25 of conductor track 23 not covered in contacting opening 35, bonding-wire connection 5 being bonded at one end 51 to pressure-sensor element 4, and with its other end 52 onto section 25 within contacting opening 35. A passivation layer 8 is deposited within contacting opening 35. For example, the passivation layer may be an epoxy resin or an acrylic adhesive. The passivation layer completely covers contacting opening 35 and section 25 of conductor track 23 not covered by base 32. End 52 of the at least one bonding-wire connection 5 is passed through the passivation layer.

Frame part 3 is filled with a gel 6, e.g., a fluorosilicone gel. By preference, gel 6 may fill almost the entire space within frame wall 31. In particular, the gel covers pressure-sensor element 4 and bonding-wire connections 5, as well as the areas of inner side 33 of base 32 not covered by pressure-sensor element 4, and passivation layer 8 in contacting opening 35.

Frame part 3 serves with base 32 as a seating surface for pressure-sensor element 4. Air pockets in the area of adhesive application 9 are able to be avoided with the aid of frame part 3. Possible burr formation on frame part 3 and unevenness or microstructures on first side 21 of carrier substrate 2 are completely covered by the frame part and passivation layer 8, so that gel 6 in frame part 3 is protected reliably against outgassing on first side 21 of carrier substrate 2, since air pockets or aggressive substances are unable to diffuse here into the gel.

What is claimed is:

1. A pressure-sensor assembly, comprising:
    a carrier substrate having conductor tracks disposed on a first side of the carrier substrate;
    a pressure-sensor element mounted on the first side of the carrier substrate and electrically contacted via a bonding-wire connection to at least one conductor track of the conductor tracks disposed on the first side of the carrier substrate;
    a frame part having a full-perimeter frame wall, the frame part being positioned on the first side of the carrier substrate around the pressure-sensor element, the frame part being filled with a gel covering the pressure-sensor element;
    wherein, in addition to the full-perimeter frame wall, the frame part has a base which is positioned on the at least one conductor track of the conductor tracks disposed on the first side of the carrier substrate, wherein a surface of the base extends above the at least one conductor track and below the pressure-sensor element and is at least partially between the at least one conductor track of the conductor tracks and the pressure-sensor element in a plane perpendicular to an extension of a surface of the at least one conductor track, wherein a bottom side of the base pointing toward the carrier substrate is adhered onto the at least one conductor track using an adhesive layer, wherein the adhesive layer is applied between the base and the at least one conductor track.

2. The pressure-sensor assembly as recited in claim 1, wherein the pressure-sensor element is mounted on an inner side of the base pointing away from the carrier substrate.

3. The pressure-sensor assembly as recited in claim 2, wherein the pressure-sensor element is adhered onto the inner side of the base pointing away from the carrier substrate.

4. The pressure-sensor assembly as recited in claim 1, wherein the base has at least one contacting opening, and at least one section of the at least one conductor track within the contacting opening is not covered by the base.

5. The pressure-sensor assembly as recited in claim 4, wherein the bonding-wire connection is electrically contacted through the contacting opening to the section of the conductor track not covered in the contacting opening, the bonding-wire connection being bonded at one end to the pressure-sensor element and with its other end onto the section within the contacting opening.

6. The pressure-sensor assembly as recited in claim 5, wherein the section of the conductor track within the contacting opening not covered by the base is covered by a passivation layer surrounding the other end of the bonding-wire connection.

7. The pressure-sensor assembly as recited in claim 6, wherein the gel within the frame part covers the passivation layer.

8. The pressure-sensor assembly as recited in claim 1, wherein the carrier substrate is a printed circuit board made of glass-fiber-reinforced epoxy resin.

9. The pressure-sensor assembly as recited in claim 1, wherein the frame part having the frame wall and the base is formed in one piece from plastic or metal.

\* \* \* \* \*